(12) United States Patent
Horii

(10) Patent No.: US 6,255,187 B1
(45) Date of Patent: Jul. 3, 2001

(54) METHOD OF FABRICATING SELF-ALIGNING STACKED CAPACITOR USING ELECTROPLATING METHOD

(75) Inventor: Hideki Horii, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/551,524

(22) Filed: Apr. 18, 2000

(30) Foreign Application Priority Data

Apr. 21, 1999 (KR) .................................................. 99-14272

(51) Int. Cl.[7] ..................................................... H01L 21/20
(52) U.S. Cl. ........................ 438/396; 438/399; 438/253; 438/256
(58) Field of Search .................................. 438/253, 239, 438/256, 258, 396, 399

(56) References Cited

U.S. PATENT DOCUMENTS 5,789,320 * 8/1998 Andricacos et al. ................. 438/678

FOREIGN PATENT DOCUMENTS

987765 * 3/2000 (EP) .

OTHER PUBLICATIONS

Hideki Horii et al.; 1999 Symposium on VLSI Technology; "A Self–Aligned Stacked Capacitor Using Novel Pt Electroplating Method For 1 Gbit DRAMs and Beyond"; pp. 103–104.

* cited by examiner

*Primary Examiner*—Trung Dang
(74) *Attorney, Agent, or Firm*—Jones Volentine, L.L.C.

(57) ABSTRACT

A method of fabricating a self-aligned stacked capacitor is provided, in which buried contacts and storage nodes are simultaneously formed by electroplating. In this method, a semiconductor substrate having exposed conductive areas is prepared for, and an interlayer insulative layer having buried contact holes that expose the conductive areas, is formed over the semiconductor substrate. A lower conductive seed layer is then formed over the entire surface of the innerwalls of the buried contact holes and the upper surface of the interlayer insulative layer. Non-conductor patterns having storage node holes that expose the buried contact holes, are then formed over the lower conductive seed layer on the upper surface of the interlayer insulative layer. A buried contact that fills the buried contact hole, and a lower electrode that fills the storage node hole, are then simultaneously formed by electroplating.

30 Claims, 9 Drawing Sheets

METHOD OF FABRICATING SELF-ALIGNING STACKED CAPACITOR USING ELECTROPLATING METHOD

This application relies for priority upon Korean Patent Application No. 99-14272, filed on Apr. 21, 1999, the contents of which are herein incorporated by reference in their entirety.

BACKGROUND OF THE INVENTION

The present invention relates to a method of fabricating a semiconductor memory device. More particularly, the present invention relates to a method of fabricating a stacked capacitor using electroplating.

As the integration of dynamic random access memories (DRAMs) has increased, methods have been proposed for thinning a dielectric film of a capacitor to increase capacitance within a limited cell area, or for changing the structure of a capacitor lower electrode to a three-dimensional structure to increase the effective area of a capacitor.

However, even though these methods have been adopted, it is difficult to obtain a sufficient capacitance for device operation in 1-Gbit or greater DRAM memory devices using an existing dielectric. In order to solve the above problem, research has actively pursued methods for replacing the dielectric film of a capacitor with a thin film having a high dielectric constant, such as $(Ba,Sr)TiO_3$ (BST), $PbZrTiO_3$ (PZT), and $(Pb,La)(Zr,Ti)$ (PLZT) films.

In conventional devices, when a high dielectric material such as BST is used in a DRAM, a buried contact (BC) is initially formed by a conductive plug such as doped polysilicon. An electrode material is then deposited to form a lower electrode, and the dielectric material is deposited, thereby fabricating the lower portion of a capacitor.

In the capacitor using the above-described high dielectric film such as a BST film, a platinum-group element or an oxide thereof, e.g., Pt, Ir, Ru, $RuO_2$, or $IrO_2$, is used as an electrode material. However, Pt, which has an excellent oxidation-resistant property, is greatly reactive with silicon. Hence, when the platinum-group elements, such as Pt, or their oxides are employed as an electrode material, a BC and a lower electrode will react with each other and mutually diffuse when the electrode material contacts the doped polysilicon that forms the BC.

Thus, in a conventional method of fabricating a capacitor, a barrier layer for separating the BC from the lower electrode must be formed between these two layers to prevent mutual reaction and diffusion from occurring between them.

However, when a barrier layer is formed between the BC and the lower electrode, oxygen may diffuse and enter into the sidewalls of the barrier layer during the formation of a dielectric layer. As a result, the conventional technique requires a special process for forming spacers to cover the sidewalls of a barrier layer, in order to prevent oxygen from diffusing through the sidewalls of a barrier layer. Consequently, the capacitor fabricating process is complicated.

Also, in the conventional technique, in order to form a lower electrode using a platinum-group metal as an electrode material, a conductive layer is formed of the platinum-group metal, and is then patterned by dry etching to form a storage node. However, the conductive layer formed of the platinum-group metal is very difficult to dry etch. As a result, when forming memory devices that have a storage node of 300 nm or less in width, particularly in 4-Gbit or more DRAMs, there is a limit in forming a lower electrode by dry etching.

SUMMARY OF THE INVENTION

To solve the above problems, an object of the present invention is to provide a method of fabricating a stacked capacitor without the need to form a barrier layer between a buried contact (BC) and a lower electrode.

Another object of the present invention is to provide a method of fabricating a stacked capacitor, by which dry etching of a conductive layer to separate storage nodes is not required when a lower electrode is formed of a conductive film such as a metal of the platinum group, and there are no misalignment problems between a BC and the lower electrode.

Accordingly, to achieve the above objects, the present invention provides a method of fabricating a stacked capacitor. In this method, a semiconductor substrate is prepared having exposed conductive areas. An interlayer insulative layer is formed over the semiconductor substrate, the interlayer insulative layer having buried contact holes that expose the conductive areas. A lower conductive seed layer is then formed over innerwalls of the buried contact holes and an upper surface of the interlayer insulative layer. Non-conductor patterns are formed over the lower conductive seed layer and the upper surface of the interlayer insulative layer, the non-conductor patterns having storage node holes that expose the buried contact holes. And then buried contacts that fill the buried contact holes, and lower electrodes that fill the storage node holes are simultaneously formed by a lower electroplating process.

The lower conductive seed layer preferably comprises a material selected from the group consisting of a platinum-group metal, a platinum-group metal oxide, a conductive perovskite material, a conductive metal, a metal silicide and a metal nitride, or a mixture of two or more of these materials. The lower conductive seed layer may also comprise a material selected from the group consisting of Pt, Rh, Ru, Ir, Os, Pd, $PtO_X$, $RhO_X$, $RuO_X$, $IrO_X$, $OsO_X$, $PdO_X$, $CaRuO_3$, $SrRuO_3$, $BaRuO_3$, $BaSrRuO_3$, $CaIrO_3$, $SrIrO_3$, $BaIrO_3$, $(La,Sr)CoO_3$, Cu, Al, Ta, Mo, W, Au, Ag, $WSi_X$, $TiSi_X$, $MoSi_X$, $CoSi_X$, $NiSi_X$, $TaSi_X$, TiN, TaN, WN, TiSiN, TiAlN, TiBN, ZrSiN, ZrAlN, MoSiN, MoAlN, TaSiN, and TaAlN, or a mixture of two or more of these materials.

The non-conductor pattern preferably comprises a material selected from the group consisting of boro-phospho-silicate glass (BPSG), spin-on glass (SOG), phospho-silicate glass (PSG), a photoresist, $SiO_X$, $SiN_X$, $SiON_X$, $TiO_X$, $AlO_X$, and $AlN_X$, or a mixture of two or more materials.

The lower electroplating process is preferably performed using ammonium platinum nitrite $(Pt(NH_3)_2(NO_2)_2)$, ammonium chloroplatinate $((NH_4)_2PtCl_6)$, or chloroplatinic acid $(H_2PtCl_6)$ as a plating solution. The lower electroplating process may also be performed using a plating solution in which metal salt containing a material selected from the group consisting of Pt, Ir, Ru, Rh, Os, Pd, Au, and Ag, or a mixture of two or more of these materials, is dissolved.

The method of fabricating a stacked capacitor may further comprise exposing a portion of the lower conductive seed layer over the upper surface of the interlayer insulative layer by removing the non-conductor patterns, after forming the buried contacts and the lower electrodes, and exposing the upper surface of the interlayer insulative layer by removing the exposed portion of the lower conductive seed layer. The exposed portion of the lower conductive seed layer is preferably removed by dry etching.

The method of fabricating a stacked capacitor may further comprise forming a dielectric layer over the lower electrode, after exposing the upper surface of the interlayer insulative layer, and forming an upper electrode over the dielectric layer.

The dielectric layer preferably comprises a material selected from the group consisting of $Ta_2O_5$, $Al_2O_3$, AlN, $SrTiO_3$ (STO), $(Ba,Sr)TiO_3$ (BST), $PbZrTiO_3$ (PZT), $SrBi_2Ta_2O_9$ (SBT), $(Pb,La)(Zr,Ti)O_3$ (PLZT), and $Bi_4Ti_3O_{12}$, or a mixture of two or more of these materials.

The upper electrode is preferably formed by chemical vapor deposition (CVD), sputtering, or metal-organic deposition (MOD). The upper electrode is preferably formed of a material selected from the group consisting of a platinum-group metal, a platinum-group metal oxide, a conductive perovskite material, a conductive metal, a metal slicide, and a metal nitride, or a mixture of two or more of these materials.

The forming of the upper electrode may further comprise forming an upper conductive seed layer over the dielectric layer, and forming an upper electrode layer over the upper conductive seed layer by an upper electroplating process.

The upper conductive seed layer preferably comprises a material selected from the group consisting of a platinum-group metal, a platinum-group metal oxide, and a conductive perovskite material, or a mixture of two or more of these materials. The upper conductive seed layer may also comprise a material selected from the group consisting of Pt, Rh, Ru, Ir, Os, Pd, $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, or a mixture of two or more of these materials.

The upper electroplating process is preferably performed using an ammonium platinum nitrite $(Pt(NH_3)_2(NO_2)_2)$, ammonium chloroplatinate $((NH_4)_2PtCl_6)$, or chloroplatinic acid $(H_2PtCl_6)$ as a plating solution. The upper electroplating process may also be performed using a plating solution in which a metal salt containing a material selected from the group consisting of Pt, Ir, Ru, Rh, Os, Pd, Au, and Ag, or a mixture of two or more of these materials is dissolved.

The conductive areas are preferably pads for electrically connecting the buried contacts to the active areas of the semiconductor substrate. The pads preferably comprise a material selected from the group consisting of doped polysilicon, a conductive metal, a metal suicide, and a metal nitride, or a mixture of two or more of these materials.

A barrier layer may be formed over the bottom of the buried contact hole after forming the interlayer insulative layer and before forming the lower conductive seed layer. The barrier layer preferably comprises TiN, TaN, WN, TiSiN, TiAlN, TiBN, ZrSiN, ZrAlN, MoSiN, MoAlN, TaSiN, TaAlN, $WSi_x$, $TiSi_x$, $MoSi_x$, $TaSi_x$, $NiSi_x$, or $CoSi_x$.

In addition, to achieve the above objects, the present invention provides a method of fabricating a stacked capacitor, including preparing a semiconductor substrate having buried contact holes that expose conductive areas formed in the semiconductor substrate. An adhesive layer is formed over sidewalls of the buried contact holes and over an upper surface of the semiconductor substrate. A lower conductive seed layer is formed over the adhesive layer. A part of the lower conductive seed layer is covered with non-conductor patterns, the non-conductor patterns having storage node holes that expose the conductive seed layer, the storage node holes being formed only over areas where the buried contact holes are formed, buried contacts that fill the buried contact holes, and lower electrodes that fill the storage node holes are then simultaneously formed by a lower electroplating process.

The conductive area is preferably a barrier layer formed of TiN, TaN, WN, TiSiN, TiAlN, TiBN, ZrSiN, ZrAlN, MoSiN, MoAlN, TaSiN, TaAlN, $WSi_x$, $NiSi_x$, $TiSi_x$, $MoSi_x$, $TaSi_x$, or $CoSi_x$. The adhesive layer preferably comprises a material selected from the group consisting of a metal nitride and a metal suicide. The lower conductive seed layer preferably comprises a material selected from the group consisting of a platinum-group metal, a platinum-group metal oxide, a conductive perovskite material, a conductive metal, a metal silicide, and a metal nitride, or a mixture of two or more of these materials. The lower conductive seed layer preferably comprises a material selected from the group consisting of Pt, Rh, Ru, Ir, Os, Pd, $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, Cu, Al, Ta, Mo, W, Au, Ag, $WSi_x$, $TiSi_x$, $MoSi_x$, $CoSi_x$, $NiSi_x$, $TaSi_x$, TiN, TaN, WN, TiSiN, TiAlN, TiBN, ZrSiN, ZrAlN, MoSiN, MoAlN, TaSiN, and TaAlN, or a mixture of two or more of these materials.

The lower electroplating process is preferably performed using an ammonium platinum nitrite $(Pt(NH_3)_2(NO_2)_2)$, ammonium chloroplatinate $((NH_4)_2PtCl_6)$, or chloroplatinic acid $(H_2PtCl_6)$ as a plating solution. The lower electroplating process may also be performed using a plating solution in which metal salt containing a material selected from the group consisting of Pt, Ir, Ru, Rh, Os, Pd, Au, and Ag, or a mixture of two or more of these material, is dissolved.

The method of fabricating a stacked capacitor may further comprise exposing a portion of the conductive seed layer by removing the non-conductor patterns, after forming the buried contacts and the lower electrodes, and removing an exposed portion of the lower conductive seed layer and a portion of the adhesive layer existing below the exposed portion of the lower conductive seed layer. The exposed portion of the lower conductive seed layer is preferably removed by dry etching.

According to the present invention, dry etching of a conductive layer is not required to separate storage nodes when a lower electrode is formed of a conductive film such as a metal of the platinum group, and there are no misalignment problems between a buried contact and the lower electrode. Furthermore, a special barrier layer is not required to be formed between the buried contact and the lower electrode, which simplifies the process for fabricating a stacked capacitor.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

A stacked capacitor fabricating method according to a first preferred embodiment of the present invention will now be described with reference to FIGS. 1A through 1H.

Figure 1A:
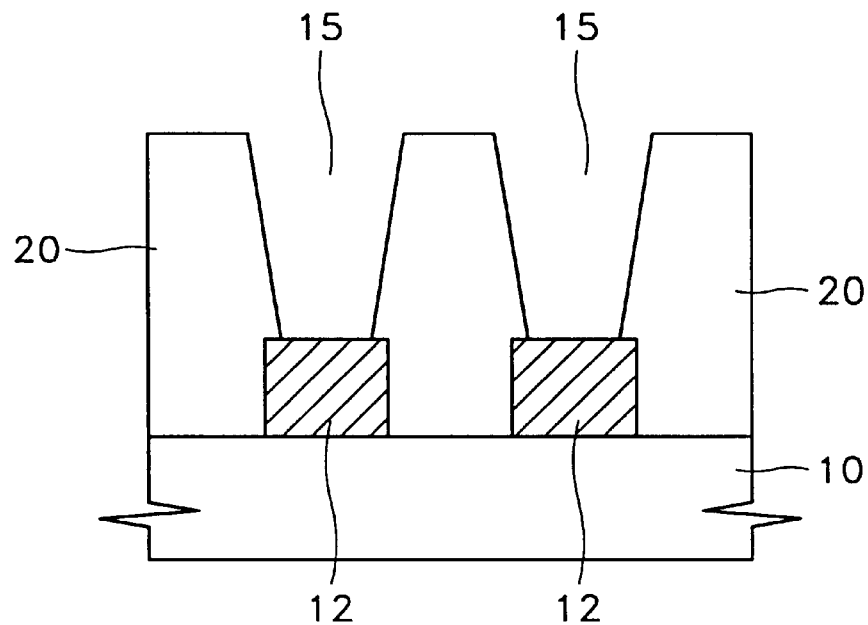
FIGS. 1A through 1H are cross-sectional views illustrating a method of fabricating a stacked capacitor, according to a first preferred embodiment of the present invention.

Referring to FIG. 1A, a plurality of pads 12 are formed of doped polysilicon over a semiconductor substrate 10. Then, in order to form a capacitor on the pads 12, an interlayer insulative layer 20 is formed over the semiconductor substrate 20 and the pads 12. This interlayer insulative layer 20 has buried contact holes (BCHs) 15 formed in it, which expose the upper surfaces of the pads 12.

The interlayer insulative layer 20 is preferably formed to a thickness of between 2000 Å and 3000 Å or to a thickness of over 3000 Å. The BCHs 15 are preferably formed to have a width of 120 nm, and the aspect ratio of the BCHs 15 is preferably 2:1 or greater.

The pad 12 is formed to electrically connect a buried contact (formed in a subsequent process) to the active area of the semiconductor substrate 10. The pad 12 preferably comprises a material selected from the group consisting of doped polysilicon, a conductive metal, metal silicide, a metal nitride, or a combination of these materials.

In the present embodiment, the pad 12 may be omitted. In other words, the BCHs 15 can be directly connected to the active area of the semiconductor substrate 10 instead of being connected via the pads 12.

Figure 1B:
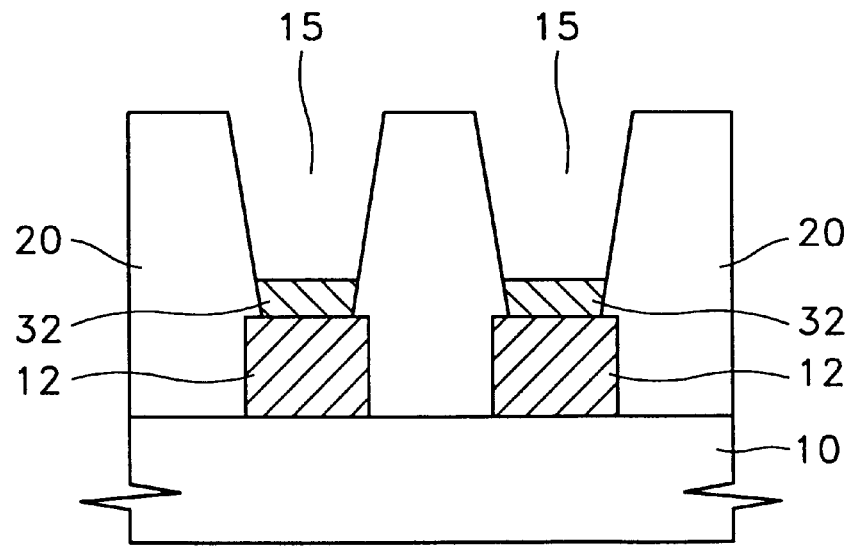

Referring to FIG. 1B, barrier layers 32 are formed over the portions of the pads 12 exposed by the BCHs 15, preferably to a thickness of about 200 to 400 Å.

In particular, a barrier material is deposited within the BCHs 15 and over the interlayer insulative layer 20, preferably by chemical vapor deposition (CVD), and is then etched back so that the barrier material remains only within the BCHs 15, thereby forming the barrier layers 32.

The barrier layers 32 are formed to prevent mutual reaction and diffusion from occurring between the pad 12 and a buried contact (BC) that will be formed in a subsequent process. The barrier layer 32 may be omitted in some circumstances.

The barrier material that forms the barrier layer 32 preferably comprises either a metal nitride such as TiN, TaN, WN, TiSiN, TiAlN, TiBN, ZrSiN, ZrAlN, MoSiN, MoAlN, TaSiN, or TaAlN, or a metal silicide such as $WSi_x$, $TiSi_x$, $MoSi_x$, $TaSi_x$, $NiSi_x$, or $CoSi_x$.

Figure 1C:
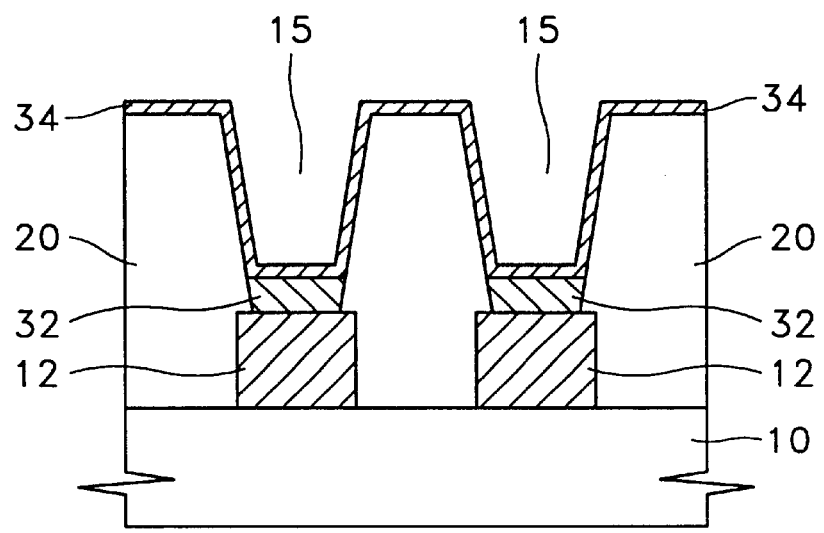

Referring to FIG. 1C, an adhesive layer 34, which covers the inner wall of each of the BCHs 15 and the upper surface of the interlayer insulative layer 20, is formed to have a thickness of about 50 to 100 Å, preferably by a CVD method.

The adhesive layer 34 improves the adhesiveness between the interlayer insulative layer 20 and subsequent metal layers used to fill in the BCHs 15, and prevents mutual diffusion between these layers. In some circumstances, the adhesive layer 34 may be omitted. The adhesive layer 34 preferably comprises either a metal nitride such as TiN, TaN, WN, TiSiN, TiAlN, TiBN, ZrSiN, ZrAlN, MoSiN, MoAlN, TaSiN, or TaAlN, or a metal silicide such as $WSi_x$, $TiSi_x$, $MoSi_x$, $TaSi_x$, or $CoSi_x$.

Referring to 1D, a conductive seed layer 40 is formed over the entire surface of the resultant structure on which the adhesive layer 34 is formed, preferably to a thickness of about 10 nm.

The conductive seed layer 40 preferably comprises an oxidation-resistant conductive material selected from the group consisting of a platinum-group metal such as Pt, Rh, Ru, Ir, Os, or Pd; a platinum-group metal oxide such as $PtO_x$, $RhO_x$, $RuO_x$, $IrO_x$, $OsO_x$ or $PdO_x$; a conductive perovskite material such as $CaRuO_3$, $SrRuO_3$, $BaRuO_3$, $BaSrRuO_3$, $CaIrO_3$, $SrIrO_3$, $BaIrO_3$, or $(La,Sr)CoO_3$; a conductive metal such as Cu, Al, Ta, Mo, W, Au, or Ag; a metal silicide such as $WSi_x$, $TiSi_x$, $MoSi_x$, or $TaSi_x$; and a metal nitride such as TiN, TaN, WN, TiSiN, TiAlN, TiBN, ZrSiN, ZrAlN, MoSiN, MoAlN, TaSiN, or TaAlN, or a combination of two or more of these materials.

When a Ru layer is formed as the conductive seed layer 40, Ru is deposited to a thickness of about 10 nm using direct current (DC) sputtering equipment, under the conditions in which the DC power is about 1000 W, the flow rate of an Ar gas is about 20 sccm, and the temperature of a wafer is about 200° C.

Figure 1D:
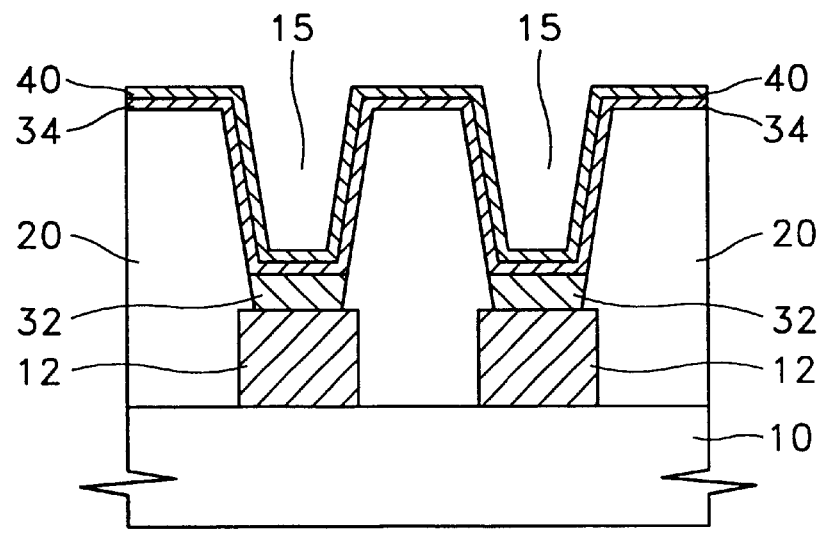
Figure 1E:
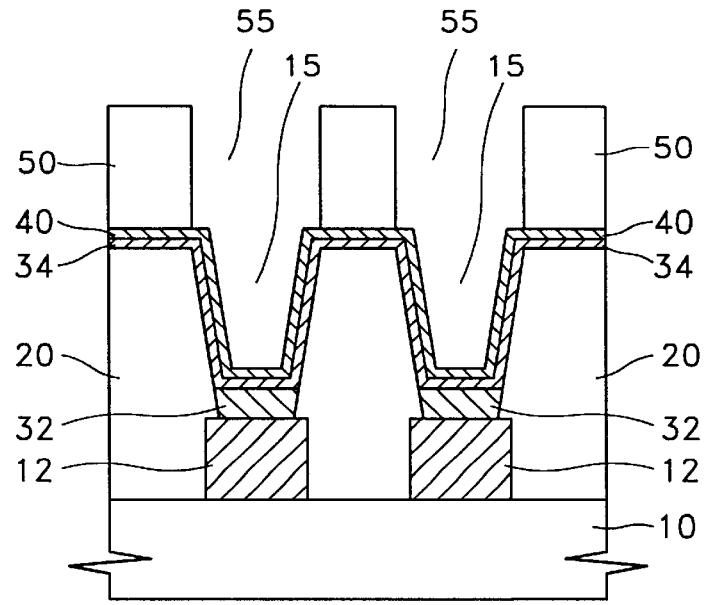

Referring to FIG. 1E, non-conductor patterns 50 are selectively formed over the resultant substrate on which the conductive seed layer 40 is formed, only over areas of the structure on which the BCHs 15 are not formed. The non-conductor patterns 50 define storage node holes (SNHs) 55, which communicate with the BCHs 15.

To be more specific, a non-conductive layer is formed over the entire surface of the resultant structure on which the conductive seed layer 40 is formed, preferably by a CVD process. The non-conductive layer can be formed to have a desired thickness according to the thickness of a lower electrode intended to be formed. For example, the non-conductive layer may be formed to have a thickness of about 500 nm.

The non-conductive layer can be formed, for example, of a material selected from the group consisting of boro-phospho-silicate glass (BPSG), spin-on glass (SOG), phospho-silicate glass (PSG), a photoresist, $SiO_x$, $SiN_x$, $SiON_x$, $TiO_x$, $AlO_x$ and $AlN_x$, or a mixture of two or more of these materials.

Next, a typical photolithography process is performed on the non-conductive layer, and only portions of the non-conductive layer formed in and over the BCHs 15 are selectively removed by reactive ion etching (RIE). This results in the formation of the non-conductor patterns 50, which define the SNHs 55, which in turn communicate with the BCHs 15 and completely expose the BCHs 15. The non-conductor patterns 50 completely cover portions of the conductive seed layer 40 that are formed over the upper surface of the interlayer insulative layer 20.

The non-conductor patterns 50 formed by the above-described method are not dissolved by a highly-acidic, high-temperature plating solution, and so are not prone to crumbling.

Figure 1F:
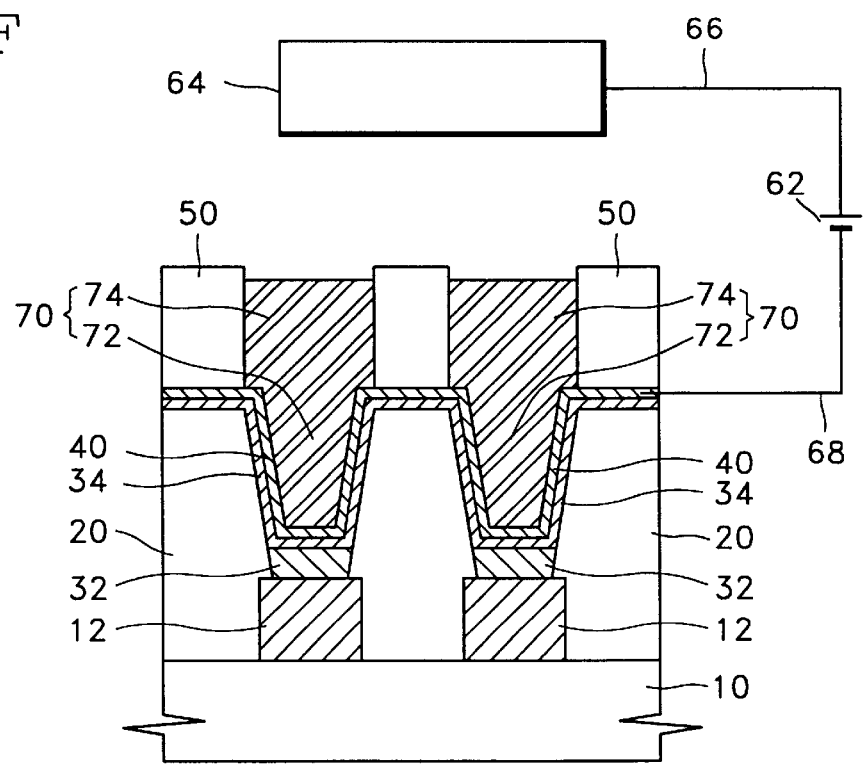

Referring to FIG. 1F, in a state where the conductive seed layer 40 is connected via a first wire 68 to the cathode of a power source 62, and an electrode 64, for example, a Pt electrode, is connected via a second wire 66 to the anode of the power source 62, electroplating is performed by dipping the resultant structure into an ammonium platinum nitrite $(Pt(NH_3)_2(NO_2)_2)$ plating solution. Consequently, a uniform platinum film is formed only on portions of the conductive seed layer 40 that are exposed through the SNHs 55 in the non-conductor patterns 50. In other words, using this process the platinum film is not formed on the non-conductor patterns 50.

The electroplating process continues until metal films 70, which completely fill the BCHs 15 and the SNHs 55, are formed. Each metal film 70 includes both a buried contact (BC) 72 and a lower electrode 74. By this process, the BCs 72 for filling the BCHs 15 and the lower electrodes 74 for filling the SNHs 55 are simultaneously formed.

Preferably, the temperature of a plating bathtub is 80° C., the concentration of a plating solution is 10 g/l, the pH of the plating solution is 1.0, the concentration of conductive salt sulfuric acid in the plating solution is 1 g/l, and the current density is 1 A/dm$^2$. In these electroplating conditions, the metal films 70, which are preferably platinum films having a thickness of about 250 nm, can be obtained by performing electroplating for about 150 seconds.

A plating solution containing metallic salts other than the $(Pt(NH_3)_2(NO_2)_2)$ plating solution may be used to fill the BCHs 15 and the SNHs 55. For example, ammonium chloroplatinate $((NH_4)_2PtCl_6)$ or chloroplatinic acid $(H_2PtCl_6)$ can also be used as the plating solution.

The plating solution may also contain a metal salt selected from the group consisting of platinum-group metals such as Pt, Ir, Ru, Rh, Os, Pd, Au, and Ag, or a mixture of two or more of these metals. The electrode 64 preferably comprises a metal selected from the group consisting of Pt, Ir, Ru, Rh, Os, Pd, Au, and Ag.

Figure 1G:
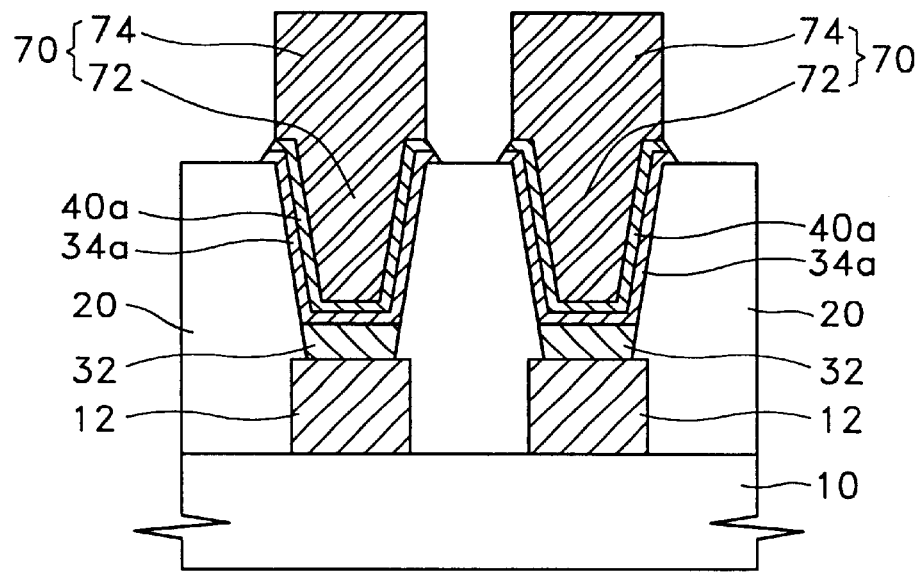

Referring to FIG. 1G, the non-conductor patterns 50 only are selectively removed by wet etching. When the non-conductor patterns 50 are formed of $SiO_2$, the non-conductor patterns 50 can be effectively removed by a wet stripping method using hydrofluoric acid (HF). This process will not remove the metal films 70.

Portions of the conductive seed layer 40 and adhesive layer 34, exposed after the non-conductor patterns 50 are removed, are then removed preferably by RIE, thereby forming seed layer patterns 40a and adhesive layer patterns 34a. As a result of this, the storage nodes are electrically isolated from each other. The lower electrodes 74 manufactured in this manner are thus self-aligned with and continuously extended from the BCs 72 so that they are integrated with the BCs 72.

As described above, the BCs 72 and the lower electrodes 74 are simultaneously formed in a self-alignment process, so that a problem of misalignment does not occur between the BCs 72 and the lower electrodes 74.

Also, since the BCs 72 and the lower electrodes 74 are simultaneously formed of the same material, the process is simpler than a conventional process in which a special barrier layer must be formed between the BCs 72 and the lower electrodes 74. Furthermore, a problem in the conventional process, in which oxygen is diffused into the barrier layer in the subsequent process for forming a dielectric layer, does not occur.

Even if oxygen is diffused from the exposed sidewalls of the adhesive layer patterns 34a in the subsequent process for forming a dielectric film, the path of diffusion of the oxygen is lengthened by a distance corresponding to the depth of the BCHs. Therefore, the diffusion of oxygen should not significantly affect the device.

Figure 1H:
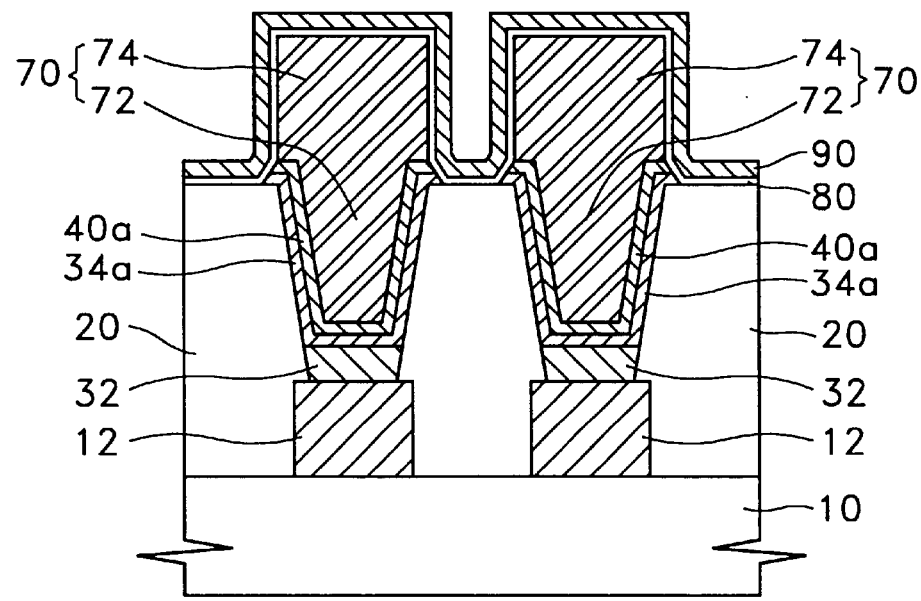

Referring to FIG. 1H, a dielectric layer 80 is formed to have a thickness of about 20 nm by depositing a dielectric material over the resultant structure, on which the lower electrodes 74 are integrated with the BCs 72. Preferably the dielectric layer 80 is deposited by CVD or sputtering. Next, an upper electrode 90 is formed, preferably having a thickness of about 50 nm, by depositing a conductive material on the resultant structure by CVD or sputtering. This completes the formation of the stacked capacitor according to the first preferred embodiment of the present invention.

The dielectric layer 80 preferably comprises a material selected from the group consisting of $Ta_2O_5$, $Al_2O_3$, AlN, $SrTiO_3$ (STO), $(Ba,Sr)TiO_3$ (BST), $PbZrTiO_3$ (PZT), $SrBi_2Ta_2O_9$ (SBT), $(Pb,La)(Zr,Ti)O_3$ (PLZT), and $Bi_4Ti_3O_{12}$, or a mixture of two or more of these materials.

The upper electrode 90 preferably comprises a material selected from the group consisting of a platinum-group metal such as Pt, Rh, Ru, Ir, Os, or Pd; a platinum-group metal oxide such as $PtO_X$, $RhO_X$, $RuO_X$, $IrO_X$, $OsO_X$ or $PdO_X$; a conductive perovskite material such as $CaRuO_3$, $SrRuO_3$, $BaRuO_3$, $BaSrRuO_3$, $CaIrO_3$, $SrIrO_3$, $BaIrO_3$ or $(La,Sr)CoO_3$; a conductive metal such as Cu, Al, Ta, Mo, W, Au, or Ag; a metal silicide such as $WSi_x$, $TiSi_x$, $MoSi_x$, or $TaSi_x$; and a metal nitride such as TiN, TaN, WN, TiSiN, TiAlN, TiBN, ZrSiN, ZrAlN, MoSiN, MoAlN, TaSiN, or TaAlN, or a mixture of two or more of these materials.

The upper electrode 90 can also be deposited by forming a thin Pt film having a thickness of about 50 nm by metal-organic deposition (MOD). In this case, using a spin-coating method, the thickness and density of the thin Pt film can be controlled by adjusting the number of rotations and the concentration of a Pt MOD solution (preferably a mixture of 10% of Pt-acetylacetonate and 90% of ethanol).

In the first preferred embodiment, deposition is used to form an upper electrode, but the present invention is not limited by this embodiment. According to the present invention, the upper electrode can be formed by electroplating as are the BCs 72 and the lower electrodes 74. This method will now be described in detail.

Figure 2:
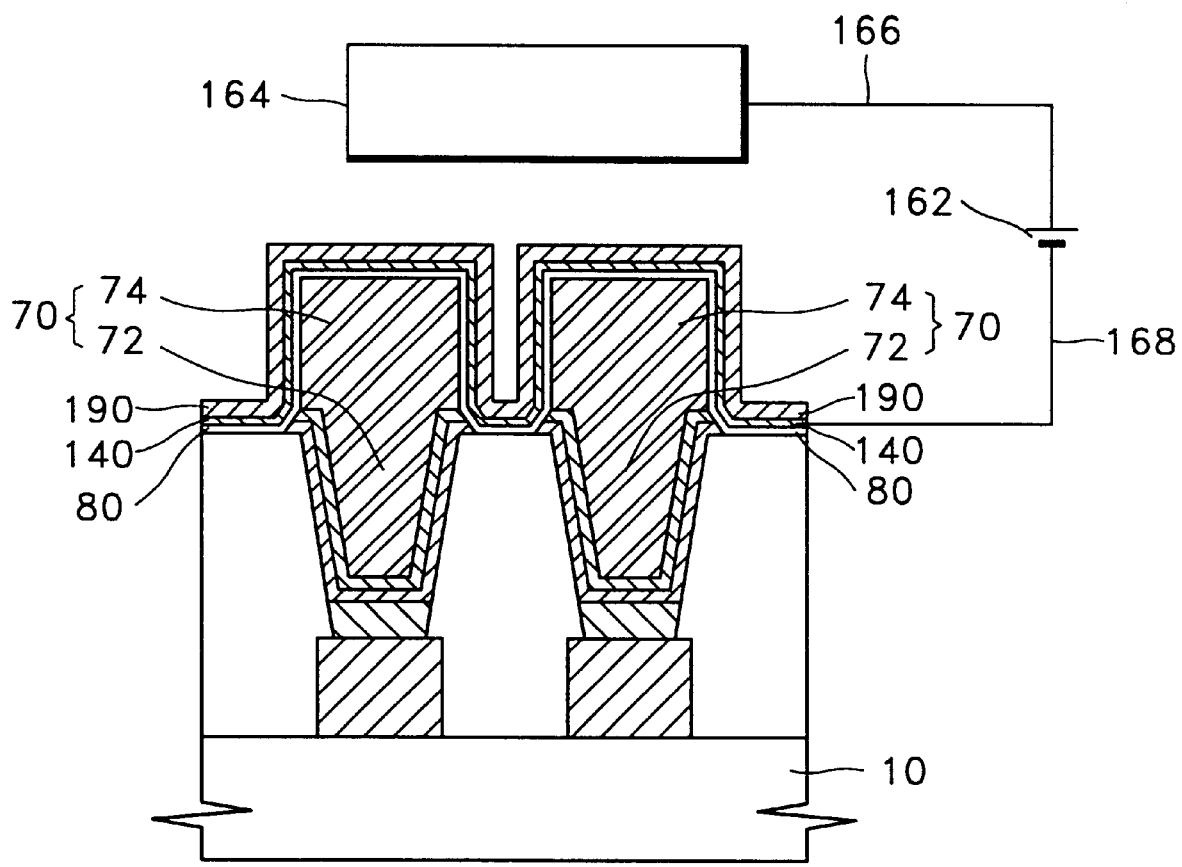
FIG. 2 is a cross-sectional view illustrating a method of fabricating a stacked capacitor, according to a second preferred embodiment of the present invention.

FIG. 2 is a cross-sectional view illustrating a method of fabricating a stacked capacitor according to a second preferred embodiment of the present invention. In the second preferred embodiment, an upper electrode 190 is formed by electroplating.

To be more specific, in the same method as that described referring to FIGS. 1A through 1G, a metal layer 70 is formed on a semiconductor substrate 10, whereby BCs 72 and lower electrodes 74 are simultaneously formed in the self-alignment method. Next, a dielectric layer 80 is formed in the same method as that described referring to FIG. 1H.

Thereafter, a second conductive seed layer 140 is formed to have a thickness of about 10 nm on the dielectric layer 80, preferably by CVD or sputtering.

As with the conductive seed layer 40 above, the second conductive seed layer 140 preferably comprises a material selected from the group consisting of a platinum-group metal such as Pt, Rh, Ru, Ir, Os, or Pd; a platinum-group metal oxide such as $PtO_X$, $RhO_X$, $RuO_X$, $IrO_X$, $OsO_X$, or $PdO_X$; a conductive perovskite material such as $CaRuO_3$, $SrRuO_3$, $BaRuO_3$, $BaSrRuO_3$, $CaIrO_3$, $SrIrO_3$, $BaIrO_3$, or $(La,Sr)CoO_3$; and a conductive metal such as Cu, Al, Ta, Mo, W, Au, or Ag, or a mixture of two or more of these materials.

Subsequently, in a state where the second conductive seed layer 140 is connected via a first wire 168 to the cathode of a power source 162, and an electrode 164 is connected via a second wire 166 to the anode of the power source 162, the upper electrode 190 is formed to have a thickness of about 50 nm on the second conductive seed layer 140, by a method such as the electroplating method that was described referring to FIG. 1D.

Here, a plating solution used in the electroplating process may contain metal salt selected from the group consisting of Pt, Ir, Ru, Rh, Os, Pd, Au, Ag, Cu, Mo, Co, Ni, Zn, Cr, and Fe, or a mixture of two or more of these metals. The electrode 164 preferably comprises a metal selected from the group consisting of Pt, Ir, Ru, Rh, Os, Pd, Au, Ag, Cu, Mo, Co, Ni, Zn, Cr, and Fe.

When the upper electrodes are formed by electroplating as in the second preferred embodiment described referring to FIG. 2, the step coverage of a film formed by electroplating is excellent, so that the upper electrodes can be easily formed over the entire surface of a wafer. Also, when the plating thickness is increased, the space between storage nodes is completely filled, so that planarization of the upper electrodes is possible.

FIGS. 3A through 3E are cross-sectional views illustrating a method of fabricating a stacked capacitor according to a third preferred embodiment of the present invention.

In the third preferred embodiment, pads 210, are formed on a semiconductor substrate 200 before a capacitor is formed. These pads 210 have a structure in which barrier patterns 232 are stacked on conductive layer patterns 212 formed of a material used to form typical pads. In this case, an additional barrier layer is not required to be formed within BCHs 15' in the subsequent process.

The barrier patterns 232 preferably comprise either a metal silicide such as $WSi_x$, $TiSi_x$, $MoSi_x$, $TaSi_x$, $NiSi_x$, or $CoSi_x$; or a metal nitride such as TiN, TaN, WN, TiSiN, TiAlN, TiBN, ZrSiN, ZrAlN, MoSiN, MoAlN, TaSiN, or TaAlN.

More specifically, a conductive layer is formed of doped silicon, a conductive metal, a metal suicide, or a metal nitride over the semiconductor substrate 200, and a barrier layer is then formed over the conductive layer. The barrier layer preferably comprises a material selected from the group consisting of the materials that can be used to form the barrier 32 of the first preferred embodiment.

Figure 3A:
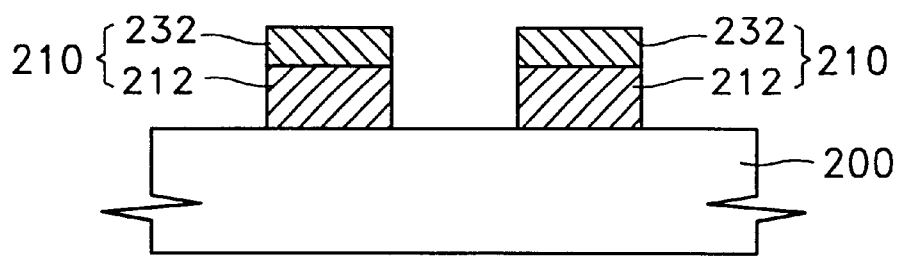
FIGS. 3A through 3E are cross-sectional views illustrating a method of fabricating a stacked capacitor, according to a third preferred embodiment of the present invention.

Next, the barrier layer and the conductive layer are simultaneously patterned, thereby forming the pads 210, which each include a conductive layer pattern 212 and a barrier pattern 232 that are sequentially stacked one on another, as shown in FIG. 3A.

Figure 3B:
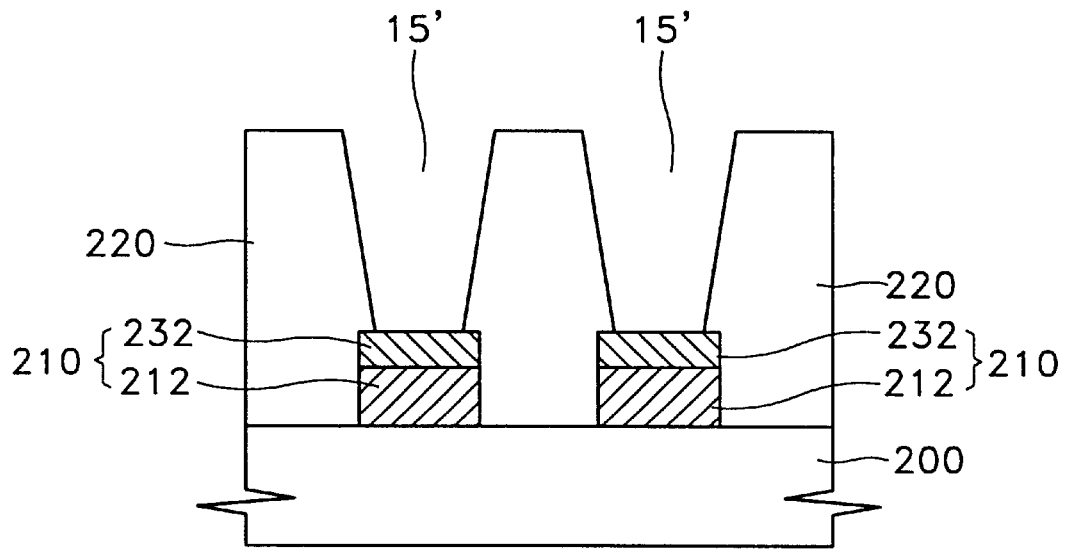

Referring to FIG. 3B, an interlayer insulative layer 220 is formed, which defines BCH's 15' that expose the upper surfaces of the barrier patterns 232 constituting the pads 210. The interlayer insulative layer 220 is preferably formed using the same method as that of forming the interlayer insulative layer 20 of FIG. 1A.

Figure 3C:
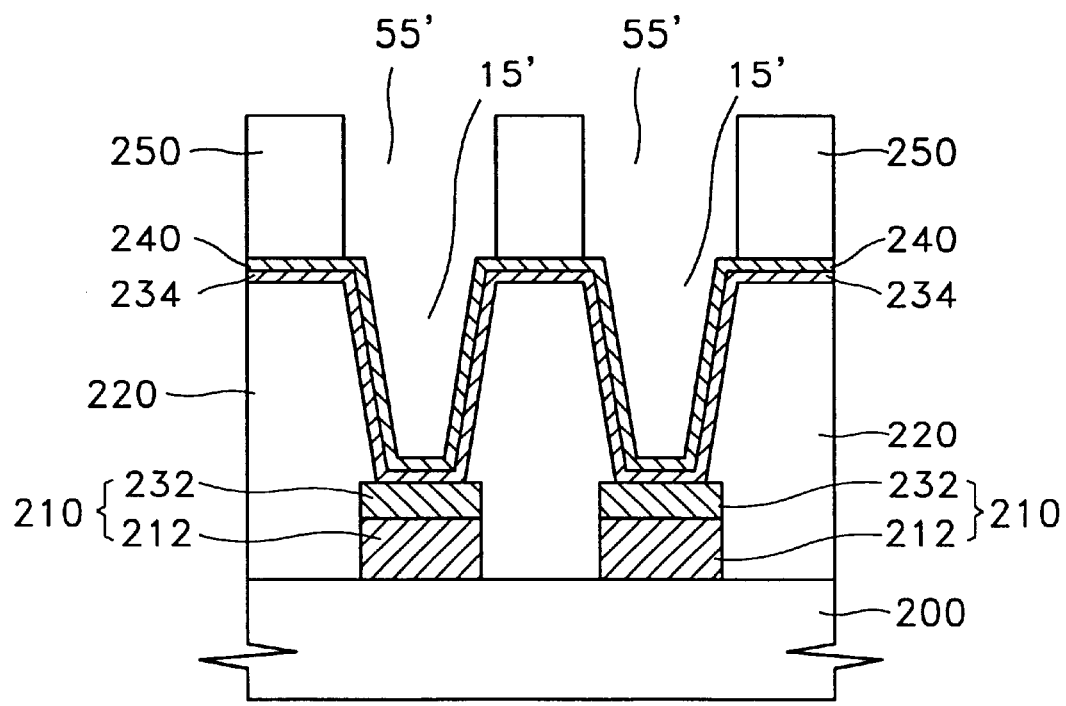

Referring to FIG. 3C, an adhesive layer 234, which covers the inner walls of the BCH's 15' and the exposed upper surface of the interlayer insulative layer 220, is then formed, preferably by the same method as that of forming the adhesive layer 34 of FIG. 1C.

Next, a conductive seed layer 240 is formed over the adhesive layer 234, preferably by the same method as that of forming the conductive seed layer 40 of FIG. 1D. Non-conductor patterns 250 defining SNH's 55', which communicate with the BCH's 15', are then formed, preferably by the same method as that of forming the non-conductor patterns 50 of FIG. 1E.

Figure 3D:
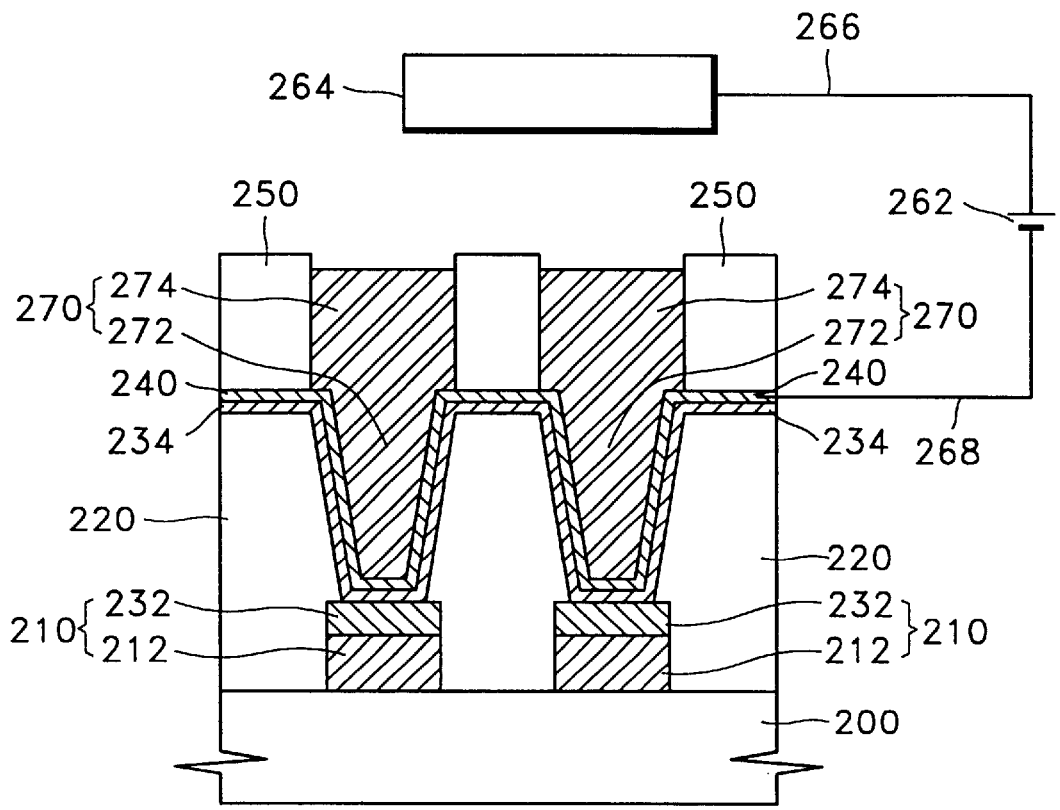

Referring to FIG. 3D, electroplating is conducted, preferably by the same method as that described above referring to FIG. 1F, in the state where the conductive seed layer 240 is connected via a wire 268 to the cathode of a power source 262, and an electrode 264 is connected via a wire 266 to the anode of the power source 262. Thus, BCs 272 which fill the BCH's 15', and lower electrodes 274 which fill the SNH's 55', are simultaneously formed.

Figure 3E:
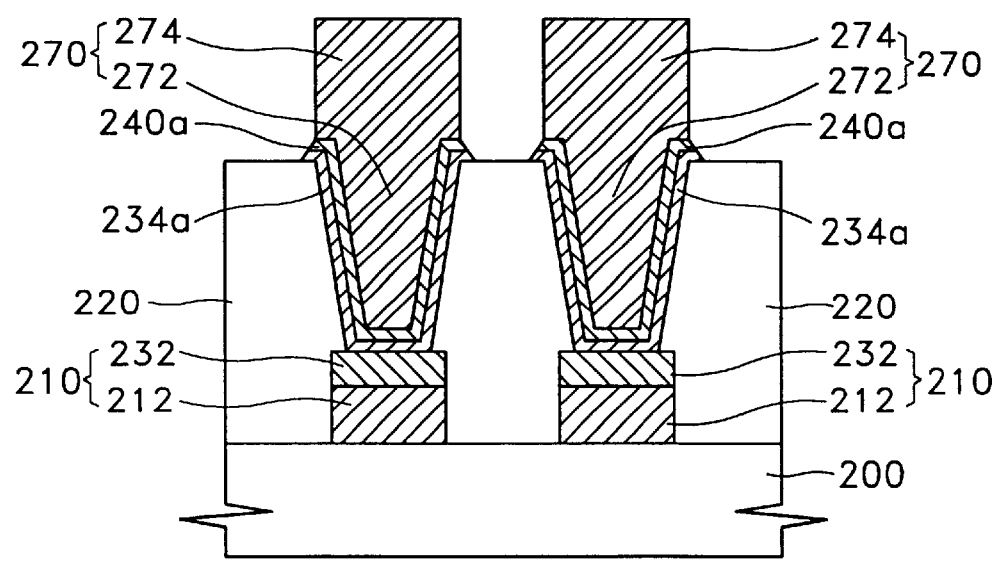

Referring to FIG. 3E, the non-conductor patterns 250 are removed, preferably by the same method as that shown in FIG. 1G, and exposed portions of the conductive seed layer 240 and adhesive layer 234 are then removed, thereby forming seed layer patterns 240a and adhesive layer patterns 234a. This electrically isolates individual storage nodes from each other, and obtains lower electrodes 274 that are self-aligned with and part of the BCs 272.

Next, a dielectric layer and upper electrodes are formed, preferably by the method of FIG. 1H or the method of FIG. 2, thereby completing the formation of the stacked capacitor according to the third preferred embodiment of the present invention.

Figure 4:
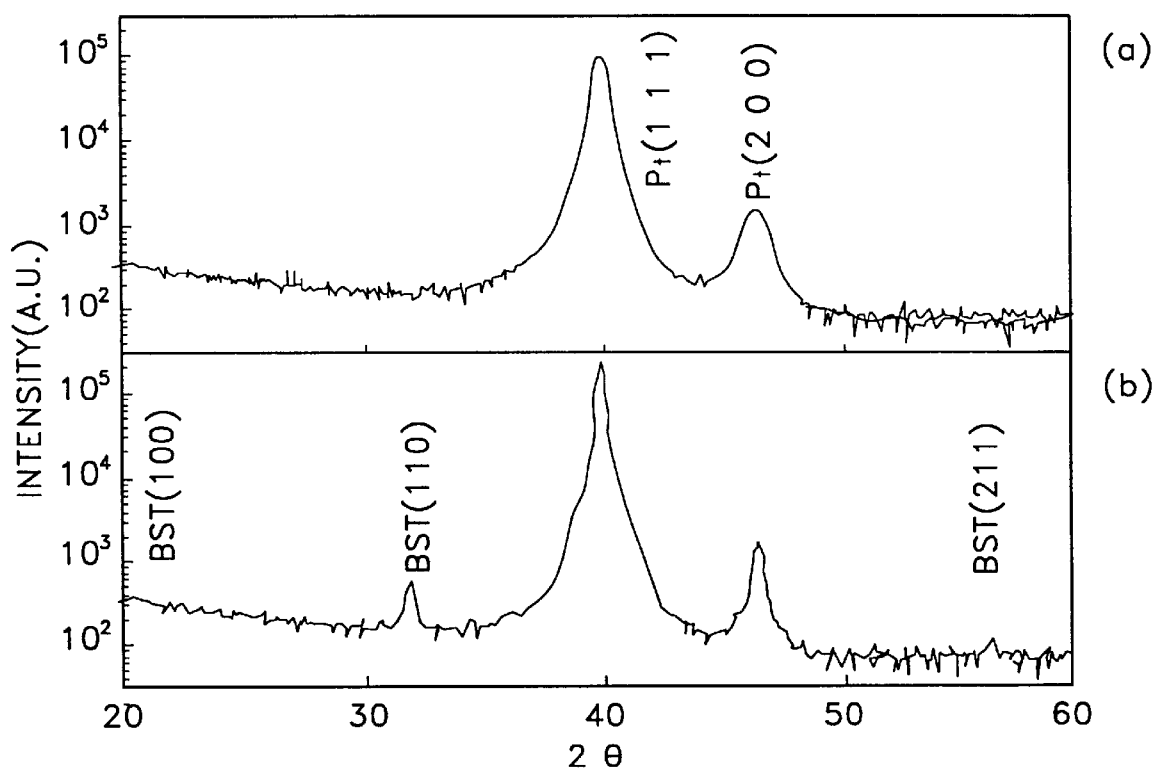
FIG. 4 shows an X-ray diffraction pattern (a) obtained after forming a buried contact and a lower electrode by electroplating Pt using a method according to a preferred embodiment of the present invention, and an X-ray diffraction pattern (b) obtained after depositing BST over the lower electrode.

FIG. 4 shows X-ray diffraction patterns for evaluating the crystal structure of a lower electrode, which is self-aligned with a BC by electroplating according to a preferred embodiment of the present invention.

To be more specific, the line (a) in FIG. 4 shows the X-ray diffraction pattern in a Pt lower electrode obtained after forming a BC and a lower electrode by electroplating Pt using a method according to the present invention, while line (b) in FIG. 4 shows an X-ray diffraction pattern obtained after depositing BST to have a thickness of 40 nm on the Pt lower electrode by sputtering at 500° C.

As can be seen by line (a), the (111) crystal azimuth of the Pt lower electrode formed by an electroplating method according to the present invention has a priority to any other azimuths, similar to the crystal azimuth obtained from a Pt layer formed by a typical sputtering method.

As can be seen by line (b), the (111) azimuth has priority to any other azimuths while the crystallinity of the Pt lower electrode is kept without change even after a BST film is formed by sputtering on the Pt lower electrode formed by the electroplating method according to the present invention.

Figure 5:
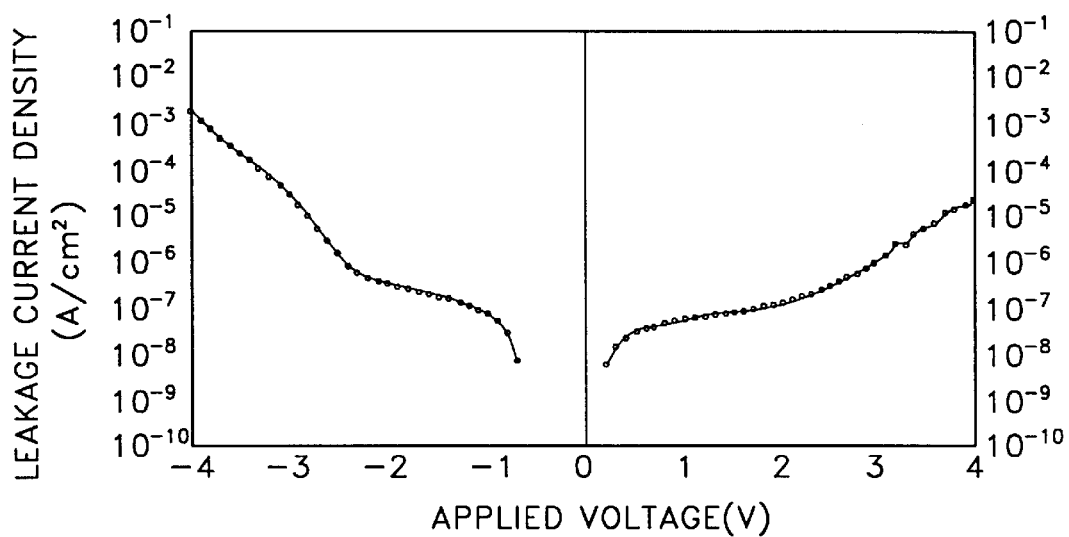
FIG. 5 is a graph for evaluating the leakage current characteristics of a capacitor fabricated according to the preferred embodiments of the present invention.

FIG. 5 is a graph for evaluating the leakage current characteristics of a capacitor fabricated according to preferred embodiments of the present invention. In particular, a capacitor obtained by forming a Pt lower electrode by electroplating according to the present invention and forming a BST dielectric layer by sputtering, is annealed at 650° C. under a nitrogen atmosphere.

As a result of measuring the leakage current density of the annealed capacitor with respect to an applied voltage, a leakage current density of 200 $nA/cm^2$ (nanoAmperes per centimeter squared) or less is obtained at ±1.5 V as shown in FIG. 5. Accordingly, it becomes evident that the Pt lower electrode formed by electroplating according to the present invention is suitable for forming a capacitor using BST as a dielectric film.

Figure 6:
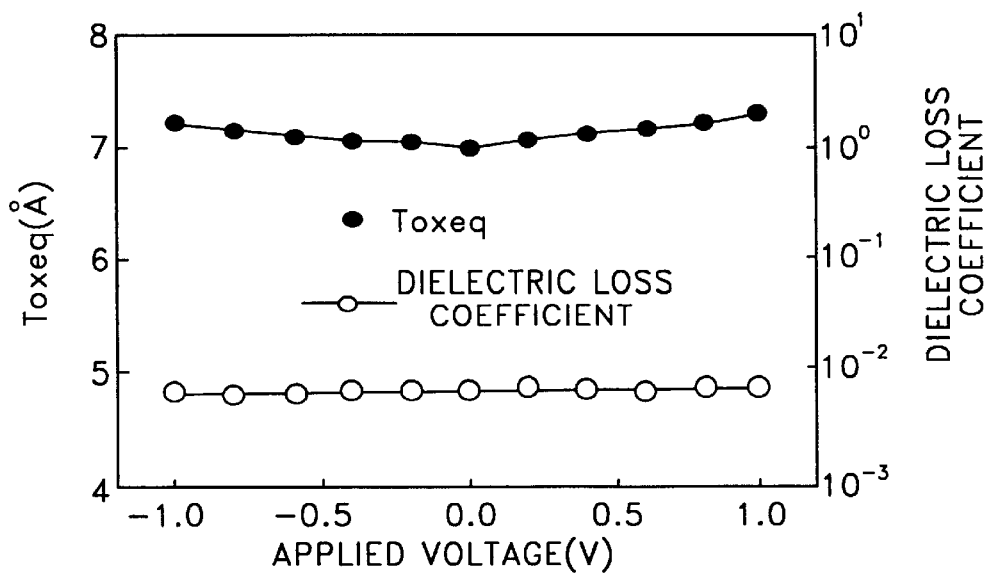
FIG. 6 is a graph showing the variation in an equivalent oxide film thickness (Toxeq) and a dielectric loss coefficient according to an applied voltage in a capacitor fabricated according to the preferred embodiments of the present invention.

FIG. 6 is a graph showing the variation in an equivalent oxide film thickness (Toxeq) and a dielectric loss coefficient according to an applied voltage, in a capacitor using the Pt lower electrode formed by electroplating according to the present invention, when a BST film deposited to a thickness of 40 nm by sputtering is adopted as a dielectric film.

As shown in FIG. 6, the Toxeq and the dielectric loss coefficient of the 40 nm BST film are 0.7 nm and 0.0080 at 0 V, respectively.

Accordingly, it becomes evident that the Pt lower electrode formed by electroplating according to the present invention is suitable for forming a capacitor that adopts BST as a dielectric film.

According to the present invention as described above, a lower electrode that is self-aligned in a body with a BC can be formed by simultaneously forming the BC and the lower electrode by electroplating. Thus, when the lower electrode is formed of a conductive film such as a platinum-group metal, the conductive film is not required to be dry-etched to separate the storage nodes. Also, because they are self-aligned, a problem of misalignment does not occur between the BC and the lower electrode.

Furthermore, the BC and the lower electrode are simultaneously formed of the same material, so that the stacked capacitor fabricating process is simpler than the conventional technique in which a special barrier layer must be formed between the BC and the lower electrode. Diffusion of oxygen into the barrier layer upon formation of the subsequent dielectric layer, which occurs in the conventional technique, does not occur in the present invention. Furthermore, even if oxygen is diffused through an adhesive layer during formation of a high dielectric layer such as BST, the operation of the device is not greatly affected since the diffusion path of oxygen is sufficiently long.

Although the invention has been described with reference to a particular embodiment, it will be apparent to one of ordinary skill in the art that modifications of the described embodiment may be made without departing from the spirit and scope of the invention.

What is claimed is:

1. A method of fabricating a stacked capacitor, comprising:

preparing for a semiconductor substrate having exposed conductive areas;

forming an interlayer insulative layer over the semiconductor substrate, the interlayer insulative layer having buried contact holes that expose the conductive areas;

forming a lower conductive seed layer over innerwalls of the buried contact holes and an upper surface of the interlayer insulative layer;

forming non-conductor patterns over the lower conductive seed layer and the upper surface of the interlayer insulative layer, the non-conductor patterns having storage node holes that expose the buried contact holes; and simultaneously forming buried contacts that fill the buried contact holes, and lower electrodes that fill the storage node holes, by a lower electroplating process.

2. A method of fabricating a stacked capacitor, as recited in claim 1, wherein the lower conductive seed layer comprises a material selected from the group consisting of a platinum-group metal, a platinum-group metal oxide, a conductive perovskite material, a conductive metal, a metal silicide and a metal nitride, or a mixture of two or more of these materials.

3. A method of fabricating a stacked capacitor, as recited in claim 2, wherein the lower conductive seed layer comprises a material selected from the group consisting of Pt, Rh, Ru, Ir, Os, Pd, $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, Cu, Al, Ta, Mo, W, Au, Ag, $WSi_x$, $TiSi_x$, $MoSi_x$, $CoSi_x$, $NiSi_x$, $TaSi_x$, TiN, TaN, WN, TiSiN, TiAlN, TiBN, ZrSiN, ZrAlN, MoSiN, MoAlN, TaSiN, and TaAlN, or a mixture of two or more of these materials.

4. A method of fabricating a stacked capacitor, as recited in claim 1, wherein the non-conductor pattern comprises a material selected from the group consisting of boro-phospho-silicate glass (BPSG), spin-on glass (SOG), phospho-silicate glass (PSG), a photoresist, $SiO_x$, $SiN_x$, $SiON_x$, $TiO_x$, $AlO_x$, and $AlN_x$, or a mixture of two or more materials.

5. A method of fabricating a stacked capacitor, as recited in claim 1, wherein the lower electroplating process is performed using ammonium platinum nitrite ($Pt(NH_3)_2(NO_2)_2$), ammonium chloroplatinate ($(NH_4)_2PtCl_6$), or chloroplatinic acid ($H_2PtCl_6$) as a plating solution.

6. A method of fabricating a stacked capacitor, as recited in claim 1, wherein the lower electroplating process is performed using a plating solution in which metal salt containing a material selected from the group consisting of Pt, Ir, Ru, Rh, Os, Pd, Au, and Ag, or a mixture of two or more of these materials, is dissolved.

7. A method of fabricating a stacked capacitor, as recited in claim 1, further comprising:

exposing a portion of the lower conductive seed layer over the upper surface of the interlayer insulative layer by removing the non-conductor patterns, after forming the buried contacts and the lower electrodes; and exposing the upper surface of the interlayer insulative layer by removing the exposed portion of the lower conductive seed layer.

8. A method of fabricating a stacked capacitor, as recited in claim 7, wherein the exposed portion of the lower conductive seed layer is removed by dry etching.

9. A method of fabricating a stacked capacitor, as recited in claim 1, further comprising:

forming a dielectric layer over the lower electrode, after exposing the upper surface of the interlayer insulative layer; and forming an upper electrode over the dielectric layer.

10. A method of fabricating a stacked capacitor, as recited in claim 9, wherein the dielectric layer comprises a material selected from the group consisting of $Ta_2O_5$, $Al_2O_3$, AlN, $SrTiO_3$ (STO), $(Ba,Sr)TiO_3$ (BST), $PbZrTiO_3$ (PZT), $SrBi_2Ta_2O_9$ (SBT), $(Pb,La)(Zr,Ti)O_3$ (PLZT), and $Bi_4Ti_3O_{12}$, or a mixture of two or more of these materials.

11. A method of fabricating a stacked capacitor, as recited in claim 9, wherein the upper electrode is formed by chemical vapor deposition (CVD), sputtering, or metal-organic deposition (MOD).

12. A method of fabricating a stacked capacitor, as recited in claim 11, wherein the upper electrode is formed of a material selected from the group consisting of a platinum-group metal, a platinum-group metal oxide, a conductive perovskite material, a conductive metal, a metal silicide, and a metal nitride, or a mixture of two or more of these materials.

13. A method of fabricating a stacked capacitor, as recited in claim 9, wherein the forming of the upper electrode further comprises:

forming an upper conductive seed layer over the dielectric layer; and forming an upper electrode layer over the upper conductive seed layer by an upper electroplating process.

14. A method of fabricating a stacked capacitor, as recited in claim 13, wherein the upper conductive seed layer comprises a material selected from the group consisting of a platinum-group metal, a platinum-group metal oxide, and a conductive perovskite material, or a mixture of two or more of these materials.

15. A method of fabricating a stacked capacitor as recited in claim 14, wherein the upper conductive seed layer comprises a material selected from the group consisting of Pt, Rh, Ru, Ir, Os, Pd, $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, or a mixture of two or more of these materials.

16. A method of fabricating a stacked capacitor, as recited in 13, wherein the upper electroplating process is performed using an ammonium platinum nitrite ($Pt(NH_3)_2(NO_2)_2$), ammonium chloroplatinate (($NH_4)_2PtCl_6$), or chloroplatinic acid ($H_2PtCl_6$) as a plating solution.

17. A method of fabricating a stacked capacitor, as recited in claim 13, wherein the upper electroplating process is performed using a plating solution in which a metal salt containing a material selected from the group consisting of Pt, Ir, Ru, Rh, Os, Pd, Au, and Ag, or a mixture of two or more of these materials is dissolved.

18. A method of fabricating a stacked capacitor, as recited in claim 1, wherein the conductive areas are pads for electrically connecting the buried contacts to the active areas of the semiconductor substrate.

19. A method of fabricating a stacked capacitor, as recited in claim 18, wherein the pads comprise a material selected from the group consisting of doped polysilicon, a conductive metal, a metal silicide, and a metal nitride, or a mixture of two or more of these materials.

20. A method of fabricating a stacked capacitor, as recited in claim 1, wherein a barrier layer is formed over the bottom of the buried contact hole after forming the interlayer insulative layer and before forming the lower conductive seed layer.

21. A method of fabricating a stacked capacitor, as recited in claim 20, wherein the barrier layer comprises TiN, TaN, WN, TiSiN, TiAlN, TiBN, ZrSiN, ZrAlN, MoSiN, MoAlN, TaSiN, TaAlN, $WSi_x$, $TiSi_x$, $MoSi_x$, $TaSi_x$, $NiSi_x$, or $CoSi_x$.

22. A method of fabricating a stacked capacitor, comprising:

preparing a semiconductor substrate having buried contact holes that expose conductive areas formed in the semiconductor substrate;

forming an adhesive layer over innerwalls of the buried contact holes and over an upper surface of the semiconductor substrate;

forming a lower conductive seed layer over the adhesive layer;

covering a part of the lower conductive seed layer with non-conductor patterns, the non-conductor patterns having storage node holes that expose the conductive seed layer, the storage node holes being formed only over areas where the buried contact holes are formed; and simultaneously forming buried contacts that fill the buried contact holes, and lower electrodes that fill the storage node holes, by a lower electroplating process.

23. A method of fabricating a stacked capacitor, as recited in claim 22, wherein the conductive area is a barrier layer formed of TiN, TaN, WN, TiSiN, TiAlN, TiBN, ZrSiN, ZrAlN, MoSiN, MoAlN, TaSiN, TaAlN, $WSi_x$, $NiSi_x$, $TiSi_x$, $MoSi_x$, $TaSi_x$, or $CoSi_x$.

24. A method of fabricating a stacked capacitor, as recited in claim 22, wherein the adhesive layer comprises a material selected from the group consisting of a metal nitride and a metal silicide.

25. A method of fabricating a stacked capacitor, as recited in claim 22, wherein the lower conductive seed layer comprises a material selected from the group consisting of a platinum-group metal, a platinum-group metal oxide, a conductive perovskite material, a conductive metal, a metal silicide, and a metal nitride, or a mixture of two or more of these materials.

26. A method of fabricating a stacked capacitor, as recited in 25, wherein the lower conductive seed layer comprises a material selected from the group consisting of Pt, Rh, Ru, Ir, Os, Pd, $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, Cu, Al, Ta, Mo, W, Au, Ag, $WSi_x$, $TiSi_x$, $MoSi_x$, $CoSi_x$, $NiSi_x$, $TaSi_x$, TiN, TaN, WN, TiSiN, TiAlN, TiBN, ZrSiN, ZrAlN, MoSiN, MoAlN, TaSiN, and TaAlN, or a mixture of two or more of these materials.

27. A method of fabricating a stacked capacitor, as recited in claim 22, wherein the lower electroplating process is performed using an ammonium platinum nitrite ($Pt(NH_3)_2(NO_2)_2$), ammonium chloroplatinate (($NH_4)_2PtCl_6$), or chloroplatinic acid ($H_2PtCl_6$) as a plating solution.

28. A method of fabricating a stacked capacitor, as recited in 22, wherein in the lower electroplating process is performed using a plating solution in which metal salt containing a material selected from the group consisting of Pt, Ir, Ru, Rh, Os, Pd, Au, and Ag, or a mixture of two or more of these material, is dissolved.

29. A method of fabricating a stacked capacitor, as recited in claim 22, further comprising:

exposing a portion of the conductive seed layer by removing the non-conductor patterns, after forming the buried contacts and the lower electrodes; and removing an exposed portion of the lower conductive seed layer and a portion of the adhesive layer existing below the exposed portion of the lower conductive seed layer.

30. A method of fabricating a stacked capacitor, as recited in claim 29, wherein the exposed portion of the lower conductive seed layer is removed by dry etching.

* * * * *